(12) United States Patent
Tien

(10) Patent No.: US 6,921,981 B2
(45) Date of Patent: Jul. 26, 2005

(54) BALL GRID ARRAY PACKAGE

(75) Inventor: Yun Hsiang Tien, Fengshan (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/335,946

(22) Filed: Jan. 3, 2003

(65) Prior Publication Data

US 2003/0127731 A1 Jul. 10, 2003

(30) Foreign Application Priority Data

Jan. 10, 2002 (TW) .......................... 91100436 A

(51) Int. Cl.⁷ .................. H01L 23/48; H01L 23/52; H01L 23/04
(52) U.S. Cl. ............... 257/786; 257/691; 257/698; 257/773; 257/784
(58) Field of Search ......................... 257/690–692, 257/698, 773, 780–786; 438/612, 616; 361/772, 802

(56) References Cited

U.S. PATENT DOCUMENTS 5,528,083 A * 6/1996 Malladi et al. ............. 257/786
6,034,427 A * 3/2000 Lan et al. ................... 257/698
6,037,669 A * 3/2000 Shu et al. ................... 257/786
6,291,898 B1 * 9/2001 Yeh et al. ................... 257/786

FOREIGN PATENT DOCUMENTS

JP          10074786 A   *  3/1998  ........... H01L/21/60
JP        2003197748 A   *  7/2003  ........... H01L/21/82

* cited by examiner

Primary Examiner—Ori Nadav

(57) ABSTRACT

A BGA package comprises a chip with an array pad design disposed on the top surface of a substrate. The chip has a plurality of bonding pads located about the periphery thereof. The bonding pads of the chip are positioned in three rows, an inner row, a middle row, and an outer row along the sides of the chip. All of the power supply pads and ground pads are adjacent to one another and designed in the outer row of the bonding pads, and the I/O pads are designed in the outer row, the middle row and the inner row of the bonding pads. The outer row, middle row, and the inner row of the bonding pads are electrically connected to the substrate through three tiers of bonding wires with different loop height, respectively.

7 Claims, 4 Drawing Sheets

BALL GRID ARRAY PACKAGE

BACKGROUND OF THE INVENTION

1. Field of the Invention

This invention generally relates to a ball grid array (BGA) package, and more particularly to a BGA package using wire-bonding technique.

2. Description of the Related Art

As electronic devices have become more smaller and thinner, the velocity and the complexity of IC chip become more and more higher. Accordingly, a need has arisen for higher package efficiency. To meet the need, the ball grid array (BGA) technology has been developed by the semiconductor industry.

Although the conductive traces pads on a BGA substrate can be lithographically defined to achieve a very fine pitch, the bond pad pitch on the semiconductor die is typically restricted from achieving a comparable pitch due to spacing and design rules used to account for wire bonding methods and tolerances, such as capillary tool interference during wire bonding.

Conventional IC bond pad designs include (a) single in-line bond pad design and (b) staggered bond pad design. Typically, the number of connections to external circuit elements, commonly referred to as "input-output" or "I/O" connections, is determined by the structure and function of the chip. Advanced chips capable of performing numerous functions may require substantial number of I/O connections. For high I/O count IC chips, the staggered bond pad design have been used so as to increase the maximum allowable pad number that can be designed on a chip. This has the benefit of providing not only more bonding pads per chip but also shorter metal wires and thus faster circuits.

FIG. 1 depicts a conventional plastic ball grid array (PBGA) package 100 comprising a chip 110 with a staggered bond pad design disposed on the upper surface of a substrate 120. The upper surface of the substrate 120 is provided with a ground ring 122, a power ring 124, and a plurality of conductive traces 126 (see FIG. 2). The active surface of the chip 110 is provided with a plurality of bonding pads 112 positioned in two rows. The bonding pads 112 on the chip 110 typically include power supply pads, ground pads and I/O pads. The power supply pads are used for supplying the source voltage. The ground pads are used for supplying the ground potential.

Typically, the number of the I/O pads accounts for about two thirds of the total number of the bonding pads 112. Thus, at least some of the outer row of bonding pads 112 must be designed as I/O pads. The outer row of bonding pads 112 is referred to as bonding pads closest to the sides of the chip. Therefore, at least four tiers of bonding wires with different loop heights are required for avoiding short circuiting wherein the bonding wires electrically connect the chip 110 to the substrate 120. The first tier bonding wires 112a (lowest loop height) connect the ground pads designed in the outer row of the bonding pads to the ground ring 122 of the substrate 120. The second tier bonding wires 112b connect the power supply pads designed in the outer row of the bonding pads to the power ring 124 of the substrate 120. The third tier bonding wires 112c connect the I/O pads designed in the outer row of the bonding pads to corresponding conductive traces 126 of the substrate 120. The fourth tier bonding wires 112d (which has a highest loop height) connect the I/O pads designed in the inner row of the bonding pads to corresponding conductive traces 126 of the substrate 120. The wire bonding parameters of each tier must be optimized individually. Therefore, the four tiers of bonding wires 112a, 112b, 112c and 112d require at least four times of wire bonding operation. Difficulty and risks of wire bonding are proportional to the times of wire bonding operation required.

Taiwan patent application No.89101235 filed by the present applicant on Jan. 24, 2000 (U.S. counterpart patent application Ser. No. 09/534,984 filed on Mar. 27, 2000), which is incorporated herein by reference, discloses a BGA package having a chip disposed on the upper surface of a substrate. The chip has a plurality of bonding pads located about the periphery thereof. The bonding pads of the chip are positioned in three rows, an inner row, a middle row, and an outer row along the sides of the chip. Only power supply pads and ground pads are designed in the outer row of bonding pads. The BGA package further includes three sets of bonding wires, wherein a first set of bonding wires electrically connect the power supply pads and ground pads on the chip to the power ring and the ground ring on the substrate respectively, a second set of bonding wires electrically connect the middle row of the bonding pads to the corresponding conductive traces on the substrate, and the third set of bonding wires electrically connect the inner row of the bonding pads to the corresponding conductive traces on the substrate. The three sets of bonding pads respectively have the same loop height. However, the patent also failed to provide a proper arrangement of the bonding pads to meet the requirement of the chip with high I/O pads.

Accordingly, there exist needs for provide a BGA package having a suitable arrangement of the bonding pads to meet requirement of the chip with high I/O pads and having the reduced loop height of the bonding wires.

SUMMARY OF THE INVENTION

It is an object of the present invention to provide a BGA package which significantly increases the maximum allowable pad number that can be designed on a chip without increasing the tiers of bonding wires thereby decreasing the difficulty of wire bonding.

It is another object of the present invention to provide a BGA package which increase the allowable pad number and shorten metal traces within the chip thereby increasing the respondent speed of the circuits on the chip.

In order to achieve the objects mentioned hereinabove, the present invention provides a BGA package comprising a substrate, a chip, a first set of bonding wires, a second set of bonding wires, a third set of bonding wires, a package body, and a plurality of solder bumps. The substrate has a top surface and a bottom surface. The top surface of the substrate has a ground ring, a power ring and a plurality of conductive traces arranged at the periphery of the ground ring and the power ring. The bottom surface has a plurality of solder pads electrically connected to the ground ring, the power ring and a plurality of the conductive traces, respectively. The chip is disposed on the top surface of the substrate and has a plurality of bonding pads located about the periphery thereof. The bonding pads of the chip are positioned in three rows, an inner row, a middle row, and an outer row along the sides of the chip, wherein all of the power supply pads and ground pads are adjacent to one another and designed in the outer row of bonding pads. The first set of the bonding wires electrically connect each bonding pad of the outer row to the ground ring, the power ring and the corresponding conductive traces on the substrate respectively, wherein each bonding wire of the first set has a loop height of substantially the same value. The second set of the bonding wires electrically connect the middle row of the bonding pads to the corresponding conductive traces on the substrate respectively, wherein each bonding wire of the second set has a loop height of substantially the same value. The third set of the bonding wires electrically connect the inner row of the bonding pads to the corresponding conductive traces on the substrate respectively, wherein each bonding wire of the third set has a loop height of substantially the same value. The package body encapsulates the chip, the bonding wires and the top surface of the substrate. The plurality of solder bumps are disposed on the solder pads provided on the bottom surface of the substrate.

Therefore, only three tiers of bonding wires with different loop heights are required for avoiding short circuiting wherein the bonding wires electrically connect the chip to the substrate. The lower tier bonding wires connect the ground pads/power supply pads designed in the outer row of the bonding pads to the ground ring/power ring of the substrate, and connect the I/O pads of the outer row to the corresponding conductive traces on the substrate. The middle tier bonding wires connect the I/O pads designed in the middle row of the bonding pads to corresponding conductive traces of the substrate. The upper tier bonding wires connect the I/O pads designed in the inner row of the bonding pads to corresponding conductive traces of the substrate. Therefore, the three tiers of bonding wires only require three times of wire bonding operation.

As mentioned above, the BGA package according to the present invention has a better arrangement of the bonding pads so as to meet the requirement of the chip with high I/O pads without increasing tiers of the bonding wires, thereby decreasing the difficulty of wire bonding. In addition, increasing the maximum allowable pad number has the benefit of providing not only more bonding pads per chip but also shorter metal wires and thus faster circuits.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
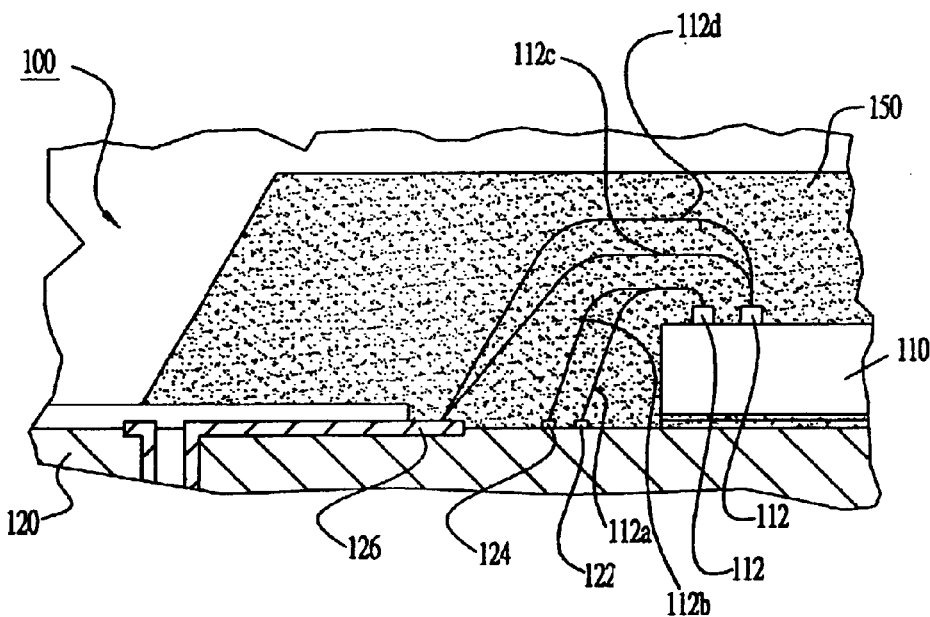
FIG. 1 is a cross sectional view of a portion of a conventional BGA package.
Figure 2:
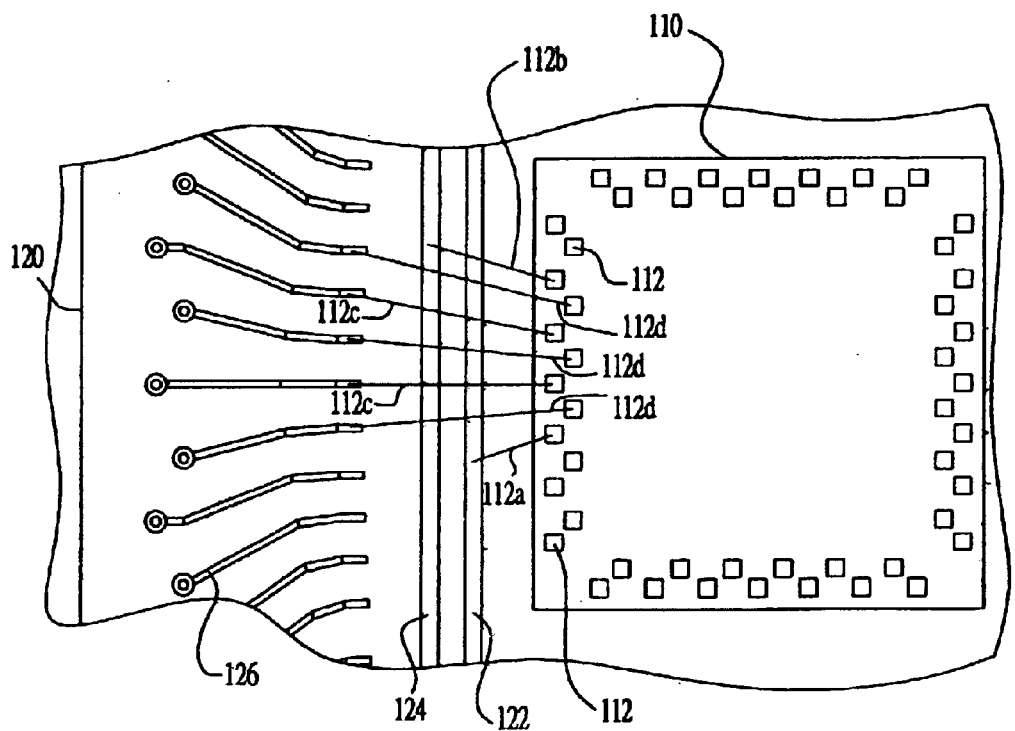
FIG. 2 is a partial top plan view of the package shown in FIG. 1 with the package body being removed.
Figure 3:
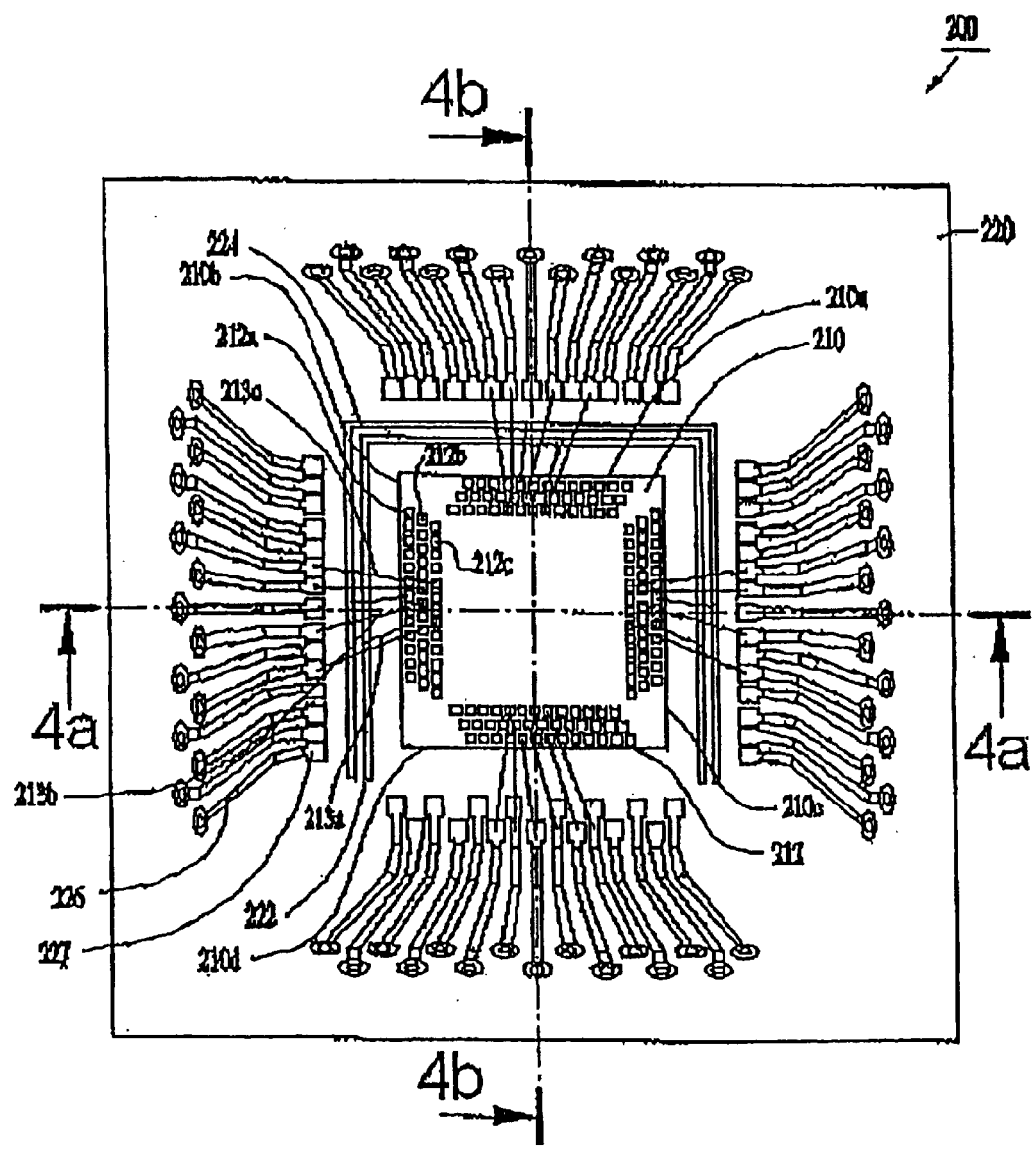
FIG. 3 is a schematic top plan view of a BGA package according to a first embodiment of the present invention with the package body being removed.

FIG. 3 depicts a schematic top plan view of a BGA package 200 according to a first embodiment of the present invention. The BGA package 200 comprises a chip 210 with an array pad design having a substantially square shape disposed on the top surface of a substrate 220. The chip 210 and the top surface of the substrate 220 are encapsulated in a package body 230 (shown in FIG. 4).

Referring to FIG. 4, the top surface of the substrate 220 is provided with a ground ring 222, a power ring 224, and a plurality of conductive traces 226 with fingers 227 arranged at the periphery of the ground ring 222 and the power ring 224. The bottom surface of the substrate 220 is provided with a plurality of solder pads (not shown) electrically connected to the ground ring 222, the power ring 224, and the conductive traces 226, respectively. Each of the solder pads is provided with a solder ball for making external electrical connection. The chip 210 has a plurality of bonding pads 212 formed on the active surface thereof and located about the periphery thereof. The bonding pads 212 are positioned in three rows along the sides of the chip 210, i.e. an outer row 212a of the bonding pads (which is closest to the edges of the chip 210), a middle row 212b of the bonding pads, and an inner row 212c of the bonding pads.

As shown in the figures, the ground ring 222 and the power ring 224 of the BGA package 200 according to a first embodiment of the present invention are U-shaped (actually shown as an up-side-down U in figures). The outer row 212a of the bonding pads includes the power supply pads, ground pads and I/O pads, wherein the power pads and ground pads are disposed on the upper side 210a, the left side 210b and the right side 210c of the chip 210, and the I/O pads are disposed on the lower side 210d of the chip 210. The middle row 212b and the inner row 212c of the bonding pads only include I/O pads. Preferably, the outer row, the middle row and the inner row of the bonding pads are staggered with respect to one another along the sides of the chip.

Figure 4A:
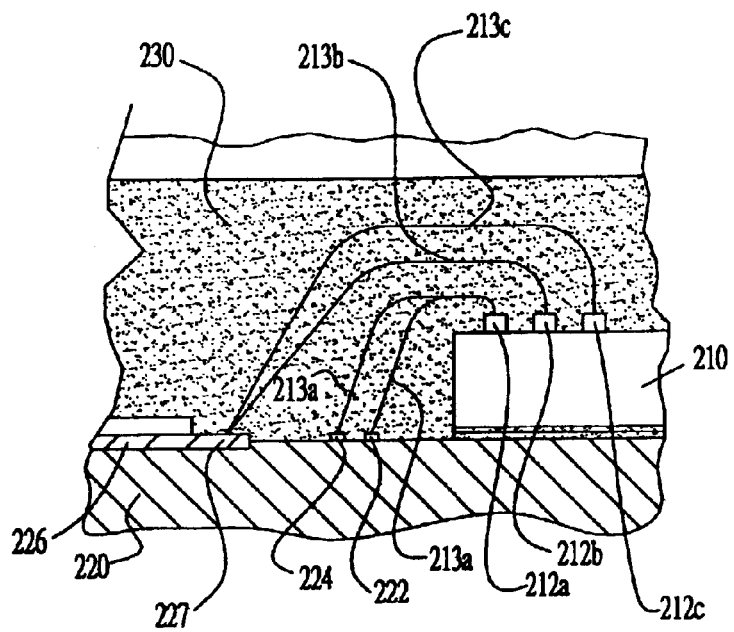
FIG. 4a and FIG. 4b are partial cross sectional schematic views of the package shown in FIG. 3 along lines 4a—4a and 4b—4b, respectively.
Figure 4B:
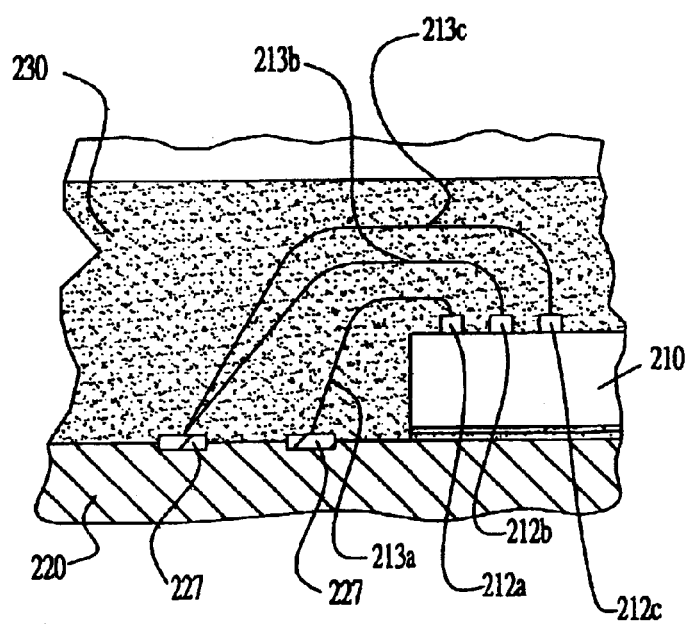

Referring now to FIG. 4a and FIG. 4b, they depict the schematic cross sectional views of the package 200 shown in FIG. 3 along lines 4a—4a and 4b—4b. It should be appreciated by those skilled in the art that the fingers 227 disposed on the lower portion of the substrate 220 are also staggered with respect to one another along the lower side of the chip 210 such that the wire bonding process of the bonding pads 212 disposed on the lower side of the chip 210 can be performed with the lower loop height and without increasing the height of the whole package 200.

As shown in FIG. 4a, the lower tier bonding wires 213a of the package 200 connect the ground pads/power supply pads designed in the outer row 212a of the bonding pads to the ground ring 222/power ring 224 of the substrate 220, wherein all of the bonding wires 213a of the lower tier have substantially the same loop height. As shown in FIG. 4b, the lower tier bonding wires 213a connect the I/O pads designed in the outer row 212a to the bonding pads disposed on the lower portion of the substrate 220, wherein all of the bonding wires 213a of the lower tier have substantially the same loop height. The middle tier bonding wires 213b of the package 200 connect the I/O pads designed in the middle row 212b to corresponding conductive traces 226 of the substrate 220, wherein all of the bonding wire 213b of the middle tier have substantially the same loop height. The upper tier bonding wires 213c connect the I/O pads designed in the inner row 212c to corresponding conductive traces 226 of the substrate 220, wherein all of the bonding wire 212c of the upper tier have substantially the same loop height. Since the loop height of each tier (lower, middle, upper) is different from one another, there is no need to consider the horizontal wire pitch between different tier bonding wires thereby increasing flexibility in designing the layout of the conductive traces on the substrate. Moreover, the three tiers of bonding wires only require three times of wire bonding operation.

Figure 5:
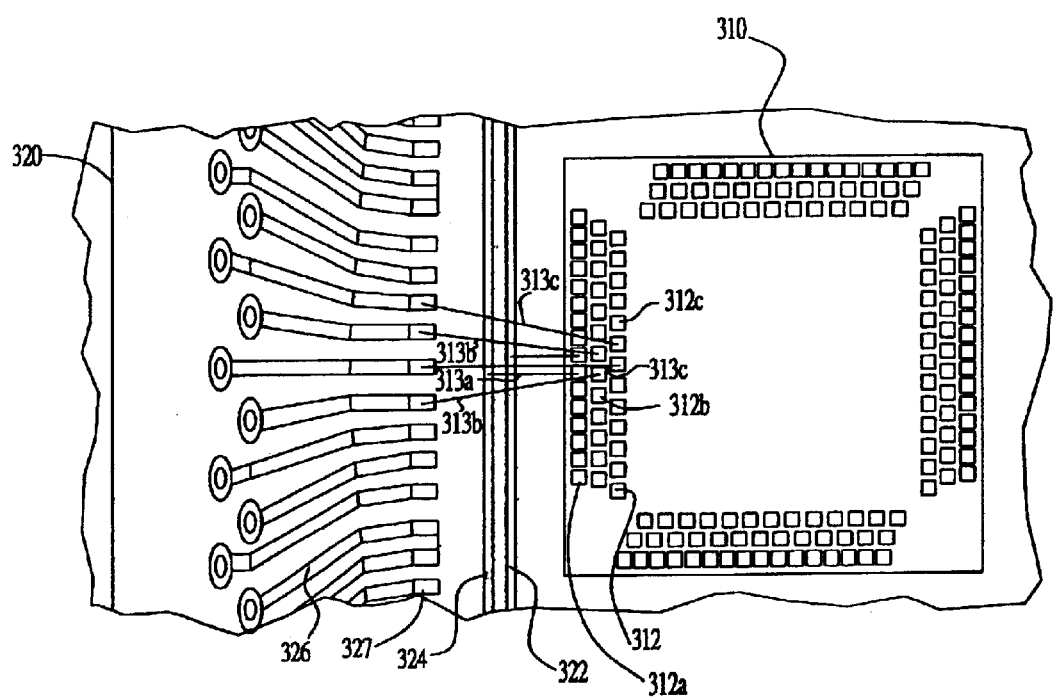
FIG. 5 is a partial top plan view of a BGA package according to a second embodiment of the present invention with the package body being removed.

FIG. 5 discloses a partial top plan view of a BGA package with the package body being removed according to a second embodiment of the present invention. The BGA package 300 is substantially identical to the BGA package 200 of FIG. 4 with the exceptions that the bond pad pitch of the outer row 312a of the bonding pads 312 is smaller than that of the middle row 312b and the inner row 312c of the bonding pads 312 on chip 310, and each bonding wire 313a of the lower tier is bonded to be substantially vertical to the corresponding edge of the chip 310. Since the lower tier bonding wires 313a connected to the outer row 312a of the bonding pads are substantially vertical to the corresponding edge of the chip 310, there is no need to consider the horizontal wire pitch arrangement between the lower tier bonding wires 313a. Therefore, the bond pad pitch of the outer row 312a of the bonding pads can be designed to be smaller than that of the middle row 312b and the inner row 312c of the bonding pads on chip 310 while still using a common tip of capillary to perform wire bonding operation.

Furthermore, the bond pad pitch of the outer row 312a of the bonding pads 312 of the BGA package 300 can be designed to be more compact while still using the tip of capillary of the same size to perform wire bonding operation. It should be noted that the bond pad pitch of the outer row of the bonding pads of the chip 310 can be diminished to about 75% of that of the middle row and the inner row of the bonding pads while still capable of using a common tip of capillary to perform the wire bonding operation of all bonding pads (including the outer, middle and inner rows). Moreover, in the BGA package 300 while each bonding wire 312a of the lower tier is preferably to be substantially vertical to the corresponding edge of the chip 310, slight variations in the bonding direction less than plus or minus 30° are still allowable for wire bonding operation.

The BGA packages in accordance with the present invention utilize a chip with an array pad design to significantly increase the maximum allowable pad number that can be designed on a chip. Moreover, the BGA package further provides a better arrangement of the bonding pads so as to meet the requirement of the chip with high I/O pads without increasing the tiers of bonding wires thereby decreasing the difficulty of wire bonding. Furthermore, increasing the maximum allowable pad number has the benefit of providing not only more bonding pads per chip but also shorter metal wires and thus faster circuits.

Although the invention has been explained in relation to its preferred embodiments, it is to be understood that many other possible modifications and variations can be made without departing from the spirit and scope of the invention as hereinafter claimed.

What is claimed is:

1. A ball grid array (BGA) package comprising:
    a substrate having opposing top and bottom surfaces, the top surface of the substrate being provided with a ground ring, a power ring, and a plurality of conductive traces arranged at the periphery of the ground ring and the power ring, the bottom surface of the substrate being provided with a plurality of solder pads electrically connected to the ground ring, the power ring, and the conductive traces, respectively;
    a semiconductor chip disposed on the top surface of the substrate, the chip having a plurality of bonding pads located about the periphery thereof, and the bonding pads of the chip being positioned in three rows, including an inner row, a middle row, and an outer row, along the sides of the chip, the middle row is interposed between the outer row and inner row while the outer row being closest to the sides of the chip, wherein all of the power supply pads and ground pads of the chip are adjacent to one another and disposed only in the outer row of the bonding pads;
    a first set of bonding wires respectively electrically connecting the outer row of the bonding pads to the ground ring, the power ring and the corresponding conductive traces on the substrate respectively, wherein each bonding wire of the first set has a loop height of substantially the same value;
    a second set of bonding wires electrically connecting the middle row of the bonding pads to the corresponding conductive traces on the substrate respectively, wherein each bonding wire of the second set has a loop height of substantially the same value;
    a third set of bonding wires electrically connecting the inner row of the bonding pads to the corresponding conductive traces on the substrate respectively, wherein each bonding wire of the third set has a loop height of substantially the same value;
    a package body encapsulating the semiconductor chip, the bonding wires and the top surface of the substrate; and
    a plurality of solder bumps disposed on the solder pads which are provided on the bottom surface of the substrate.

2. The BGA package as claimed in claim 1, wherein the chip is a substantial rectangle in shape, and the power supply pads and ground pads disposed in the outer row of the bonding pads are arranged on three sides of the rectangle.

3. The BGA package as claimed in claim 2, wherein the ground ring and the power ring of the substrate are substantially U-shaped.

4. The BGA package as claimed in claim 1, wherein the outer row of the bonding pads, the middle row of the bonding pads and the inner row of the bonding pads are staggered with respect to one another along the sides of the chip.

5. The BGA package as claimed in claim 1, wherein each bonding wire of the first set is substantially vertical to the corresponding edge of the chip.

6. The BGA package as claimed in claim 1, wherein the bond pad pitch of the outer row of the bonding pads is smaller than that of the middle row of the bonding pads and the inner row of the bonding pads.

7. The BGA package as claimed in claim 4, wherein the bond pad pitch of the outer row of the bonding pads is at least about 75% of that of the middle row of the bonding pads and the inner row of the bonding pads.

* * * * *